United States Patent
Willson et al.

(10) Patent No.: US 8,926,888 B2
(45) Date of Patent: Jan. 6, 2015

(54) FLUORINATED SILAZANE RELEASE AGENTS IN NANOIMPRINT LITHOGRAPHY

(75) Inventors: Carlton Grant Willson, Austin, TX (US); Tsuyoshi Ogawa, Kawagoe (JP); Michael W. Lin, Houston, TX (US); Daniel J. Hellebusch, Berkeley, CA (US); B. Michael Jacobsson, Fort Worth, TX (US); William K. Bell, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 260 days.

(21) Appl. No.: 13/404,083

(22) Filed: Feb. 24, 2012

(65) Prior Publication Data

US 2012/0217676 A1 Aug. 30, 2012

Related U.S. Application Data

(60) Provisional application No. 61/446,702, filed on Feb. 25, 2011.

(51) Int. Cl.
| | |
|---|---|
| *G03F 7/004* | (2006.01) |
| *G03F 7/00* | (2006.01) |
| *B82Y 10/00* | (2011.01) |
| *B82Y 40/00* | (2011.01) |
| *B29C 35/08* | (2006.01) |

(52) U.S. Cl.
CPC .............. *G03F 7/0002* (2013.01); *B82Y 10/00* (2013.01); *B82Y 40/00* (2013.01)
USPC ......................... 264/496; 425/385; 430/270.1

(58) Field of Classification Search
USPC ....................................................... 977/887
See application file for complete search history.

(56) References Cited

U.S. PATENT DOCUMENTS

| | | | | |
|---|---|---|---|---|
| 5,061,740 | A | * 10/1991 | Inomata | ........................ 523/213 |
| 5,670,299 | A | * 9/1997 | Urano et al. | .................. 430/326 |
| 6,873,087 | B1 | 3/2005 | Choi et al. | |
| 6,932,934 | B2 | 8/2005 | Choi et al. | |
| 6,936,194 | B2 | 8/2005 | Watts | |
| 7,077,992 | B2 | 7/2006 | Sreenivasan et al. | |

(Continued)

FOREIGN PATENT DOCUMENTS

| | | |
|---|---|---|
| JP | 10026703 | 1/1998 |
| JP | 2009149782 | * 9/2009 |
| JP | 2010143975 | * 9/2010 |

OTHER PUBLICATIONS

Colburn, Matthew, Step and Flash Imprint Lithography: A Low-Pressure, Room-Temperature Nanoimprint Lithography, Ph.D. Dissertation, The University of Texas at Austin, 2001, Chapter 3.*

(Continued)

*Primary Examiner* — Matthew Daniels
(74) *Attorney, Agent, or Firm* — Heather L. Flanagan; Fish & Richardson P.C.

(57) ABSTRACT

An imprint lithography release agent having general formula (1):

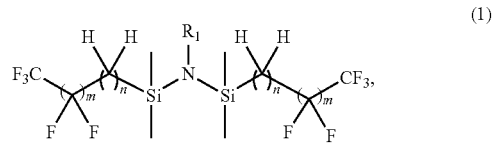

(1)

where $R_1$ represents H or $CH_3$, n is an integer from 1 to 5, and m is an integer from 1 to 40. Fluorinated silazanes of general formula (1) can be used to form a release layer on an imprint lithography template, added to an imprint lithography resist, or both.

11 Claims, 2 Drawing Sheets

(56) References Cited

U.S. PATENT DOCUMENTS

| | | | |
|---|---|---|---|
| 7,157,036 B2 | 1/2007 | Choi et al. | |
| 7,179,396 B2 | 2/2007 | Sreenivasan | |
| 7,396,475 B2 | 7/2008 | Sreenivasan | |
| 8,349,241 B2 | 1/2013 | Sreenivasan et al. | |
| 2004/0065252 A1 | 4/2004 | Sreenivasan et al. | |
| 2005/0160934 A1* | 7/2005 | Xu et al. | 101/454 |
| 2005/0187339 A1 | 8/2005 | Xu et al. | |
| 2007/0149798 A1* | 6/2007 | Ogawa et al. | 556/466 |

OTHER PUBLICATIONS

Jen, Wei-Lun Kane, Materials and Processes for Advanced Lithography Applications, Ph.D. Dissertation, The University of Texas at Austin, 2009, Chapter 5.*

Bender, M. et al., Multiple imprinting in UV-based nanoimprint lithography: related material issues, Microelectronic Engineering, vol. 61-62 (2002), pp. 407-413.*

Machine translation of JP 2010143975 to Mitsuo Muto et al., Jul. 1, 2010.*

Machine translation of JP 2009149782 to Mistuo Muto et al., Jul. 9, 2009.*

Chou et al., Imprint of Sub-25 nm Vias and Trenches in Polymers; Appl. Phys. Lett. 67 (21) Nov. 20, 1995.

Chou et al., Nanoimprint Lithography; Journal of Vacuum Science Technolgoy B 14(16), pp. 4129-4133 Nov. 1, 1996.

Long et al. Materials for step and flash imprint lithography (S-FIL); Journal of Materials Chemistry 17:3575-3580 Jun. 15, 2007.

* cited by examiner

FLUORINATED SILAZANE RELEASE AGENTS IN NANOIMPRINT LITHOGRAPHY

CROSS-REFERENCE TO RELATED APPLICATIONS

The application claims the benefit under 35 U.S.C. §119 (e)(1) of U.S. Provisional Application No. 61/446,702 filed on Feb. 25, 2011, which is hereby incorporated by reference in its entirety.

TECHNICAL FIELD

The present invention is related to fluorinated silazane release agents in nanoimprint lithography.

BACKGROUND

As the semiconductor processing industry strives for larger production yields while increasing the number of circuits per unit area, attention has been focused on the continued development of reliable high-resolution patterning techniques. One such technique in use today is commonly referred to as imprint lithography. Imprint lithography processes are described in detail in numerous publications, such as U.S. Patent Application Publication No. 2004/0065976, U.S. Patent Application Publication No. 2004/0065252, and U.S. Pat. No. 6,936,194, all of which are incorporated by reference herein. Other areas of development in which imprint lithography has been employed include biotechnology, optical technology, mechanical systems, and the like.

An imprint lithography technique disclosed in each of the aforementioned U.S. patent application publications and patent includes formation of a relief pattern in an imprint resist and transferring a pattern corresponding to the relief pattern into an underlying substrate. The patterning process uses a template spaced apart from the substrate and a polymerizable composition disposed between the template and the substrate. The polymerizable composition (or imprint resist) is solidified to form a layer that has a pattern conforming to a shape of the surface of the template that contacts the polymerizable composition. After solidification, the template is separated from the patterned layer such that the template and the substrate are spaced apart.

In some cases, portions of the solidified imprint resist adhere to the template, and can result in separation defects in the patterned layer as well as defects in subsequent patterned layers formed with the same template. Efforts to reduce separation defects related to adherence of solidified imprint resist on the template include formation of a release layer on the surface of the template before imprinting to modify the surface energy of the template. These previously applied release layers, such as one formed by treatment of the template with tridecafluoro-1,1,2,2-tetrahydrooctyl dimethylchlorosilane, typically degrades with use. As the previously applied release layer degrades, subsequent separation of the template from the solidified imprint resist can become increasingly more difficult (e.g., as the number of successive imprints increases in a step-and-repeat process), contributing to the introduction of separation defects in the imprinted patterns and reducing the number of successive imprints that can be made with the template.

SUMMARY

In one aspect, a fluorinated silazane release agent for nanoimprint lithography has general formula (1):

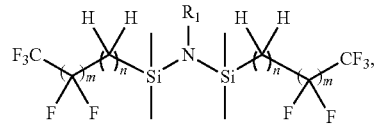

where $R_1$ represents H or $CH_3$, n is an integer from 1 to 5, and m is an integer from 1 to 40. The fluorinated silazane having general formula (1) can be applied to an imprinting surface of an imprint lithography template to form a release layer on the imprinting surface of the template before the template is used to form imprinted patterns.

In another aspect, an imprint lithography resist includes a fluorinated silazane having general formula (1), where $R_1$ represents H or $CH_3$, n is an integer from 1 to 5, and m is an integer from 1 to 40.

In another aspect, an imprint lithography mold assembly includes an imprint lithography substrate, an imprint lithography resist disposed on the imprint lithography substrate, and an imprint lithography template in contact with the imprint lithography resist. The imprint lithography resist includes a fluorinated silazane having general formula (1), where $R_1$ represents H or $CH_3$, n is an integer from 1 to 5, and m is an integer from 1 to 40.

In yet another aspect, an imprint lithography method includes disposing an imprint lithography resist on an imprint lithography substrate, contacting the imprint lithography resist with a surface of an imprint lithography template, solidifying the imprint lithography resist in contact with the surface of the imprint lithography template to form a solidified patterned layer adhered to the imprint lithography substrate and in contact with the surface of the imprint lithography template, and separating the surface of the imprint lithography template from the solidified patterned layer. The imprint lithography resist includes a fluorinated silazane having general formula (1), where $R_1$ represents H or $CH_3$, n is an integer from 1 to 5, and m is an integer from 1 to 40.

Implementations can include one or more of the following features. In an example, in a fluorinated silazane of general formula (1), $R_1$=H, n=2, and m=5. In some cases, the imprint lithography resist includes a photoinitiator. The imprint lithography resist may include a solvent. The fluorinated silazane may comprise about 0.1 wt % to about 30 wt % of the imprint lithography resist. If the imprint lithography resist includes solvent, the fluorinated silazane may comprise about 0.1 wt % to about 30 wt % of the imprint lithography resist excluding the solvent.

In some imprint lithography mold assemblies or methods, the imprint resist can be disposed on the substrate in the form of discrete, spaced-apart drops. The imprint lithography template may include a release layer applied to the imprinting surface of the template before the template is used to form imprinted patterns. In some cases, an imprint lithography method includes forming the release layer on the imprinting surface of the template before the template is used to make imprinted patterns, or before the imprint resist is disposed on the substrate. The release layer may include a second fluorinated silazane having general formula (1), where $R_1$ represents H or $CH_3$, n is an integer from 1 to 5, and m is an integer from 1 to 40. In some embodiments, the second fluorinated silazane is the same as the fluorinated silazane in the imprint resist. In other embodiments, the second fluorinated silazane is different from the fluorinated silazane in the imprint resist.

When used to form a release layer in nanoimprint lithography, the fluorinated silazanes described herein have been shown to provide a water contact angle on an imprint lithography template comparable to that of other release agents, while unexpectedly extending the useful life of the imprint lithography template by reducing the number and severity of separation defects. These fluorinated silazanes have also been shown to have a long shelf life.

Thus, particular embodiments have been described. Variations, modifications, and enhancements of the described embodiments and other embodiments can be made based on what is described and illustrated. In addition, one or more features of one or more embodiments may be combined. The details of one or more implementations and various features and aspects are set forth in the accompanying drawings, the description, and the claims below.

DETAILED DESCRIPTION

Figure 1:
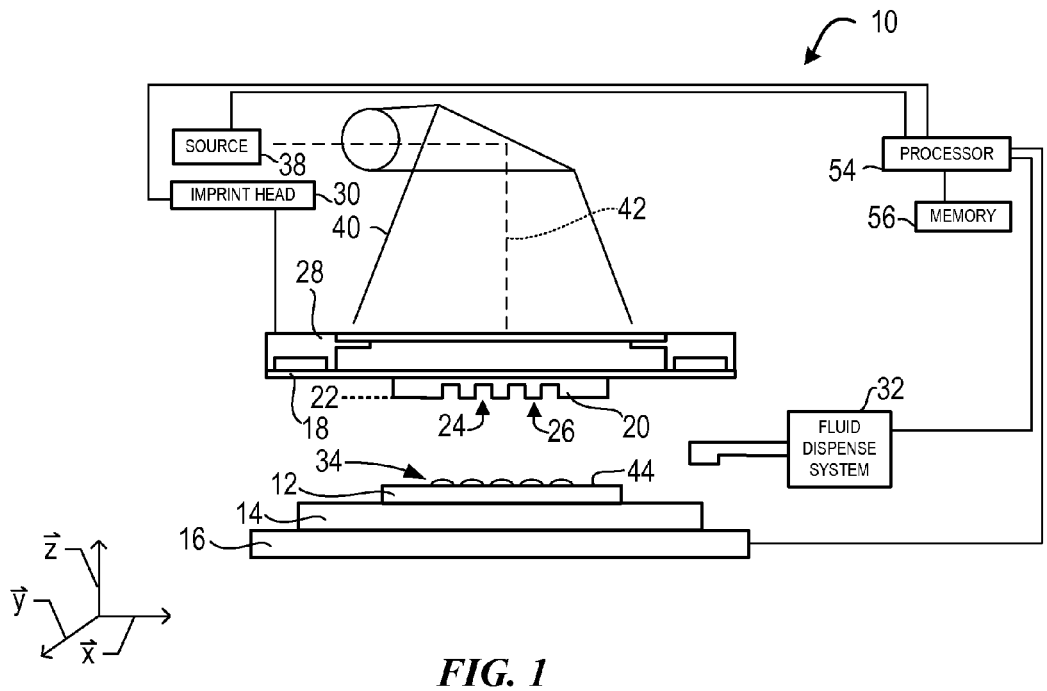
FIG. 1 illustrates a simplified side view of a lithographic system.

Referring to FIG. 1, illustrated therein is a lithographic system 10 of the sort used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is incorporated by reference herein. Substrate 12 and substrate chuck 14 may be further supported by stage 16. Stage 16 may provide motion about the x-, y-, and z-axes. Stage 16, substrate 12, and substrate chuck 14 may also be positioned on a base (not shown).

Spaced-apart from substrate 12 is a template 18. Template 18 generally includes a rectangular or square mesa 20 some distance from the surface of the template towards substrate 12. A surface of mesa 20 may be patterned. In some cases, mesa 20 is referred to as mold 20 or mask 20. Template 18 and/or mold 20 may be formed from such materials including, but not limited to, fused silica, quartz, silicon, silicon nitride, organic polymers, siloxane polymers, borosilicate glass, fluorocarbon polymers, metal (e.g., chrome, tantalum), hardened sapphire, or the like, or a combination thereof. As illustrated, patterning of surface 22 includes features defined by a plurality of spaced-apart recesses 24 and/or protrusions 26, though embodiments are not limited to such configurations. Patterning of surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is incorporated by reference herein. Further, chuck 28 may be coupled to imprint head 30 such that chuck 28 and/or imprint head 30 may be configured to facilitate movement of template 18.

System 10 may further include a fluid dispense system 32. Fluid dispense system 32 may be used to deposit polymerizable material 34 on substrate 12. Polymerizable material 34 may be dispensed upon substrate 12 using techniques such as drop dispense, spin-coating, dip coating, chemical vapor deposition (CVD), physical vapor deposition (PVD), thin film deposition, thick film deposition, and/or the like. In a drop dispense method, polymerizable material 34 is disposed on substrate 12 in the form of discrete, spaced-apart drops.

Polymerizable material 34 includes a mixture of polymerizable components, as described in U.S. Pat. No. 7,157,036 and U.S. Patent Application Publication No. 2005/0187339, as well as Chou et al. 1995. Imprint of sub-25 nm vias and trenches in polymers. *Applied Physics Letters* 67(21):3114-3116; Chou et al. 1996. Nanoimprint lithography. *Journal of Vacuum Science Technology B* 14(6): 4129-4133; and Long et al. 2007. Materials for step and flash imprint lithography (S-FIL®). *Journal of Materials Chemistry* 17:3575-3580, all of which are incorporated by reference herein. Polymerizable material 34 can include polymerizable monomers, cross-linkers, resins, or any combination thereof. Classes of monomers include acrylates, methacrylates, vinyl ethers, and epoxides, as well as polyfunctional derivatives thereof. In some cases, polymerizable material 34 is substantially free of silicon. In other cases, polymerizable material 34 is silicon-containing. Silicon-containing monomers include, for example, siloxanes and disiloxanes. Resins can be silicon-containing (e.g., silsesquioxanes) and non-silicon-containing (e.g., novolak resins). Polymerizable material 34 may also include one or more polymerization initiators or free radical generators. Classes of polymerization initiators include, for example, photoinitiators (e.g., acyloins, xanthones, and phenones), photoacid generators (e.g., sulfonates and onium salts), and photobase generators (e.g., ortho-nitrobenzyl carbamates, oxime urethanes, and O-acyl oximes). In some embodiments, imprint resists include solvents (e.g., propylene glycol methyl ether acetate (PGMEA), propylene glycol monomethyl ether (PGME), and the like) to adjust a viscosity of the imprint resist.

Figure 2:
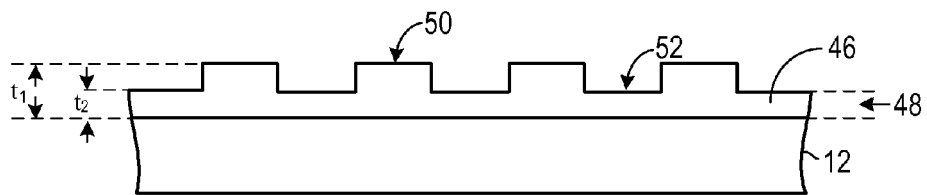
FIG. 2 illustrates a simplified side view of the substrate shown in FIG. 1 having a patterned layer positioned thereon.

Referring to FIGS. 1 and 2, system 10 may further include an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Imprint head 30 may apply a force to template 18 such that mold 20 contacts polymerizable material 34. After the desired volume is filled with polymerizable material 34, source 38 produces energy 40, e.g., electromagnetic radiation or thermal energy, causing polymerizable material 34 to solidify and/or cross-link, conforming to shape of a surface 44 of substrate 12 and patterning surface 22, defining a patterned layer 46 on substrate 12. Patterned layer 46 may include a residual layer 48 and a plurality of features shown as protrusions 50 and recessions 52, with protrusions 50 having a thickness $t_1$ and residual layer 48 having a thickness $t_2$.

The above-described system and process may be further implemented in imprint lithography processes and systems referred to in U.S. Pat. Nos. 6,932,934; 7,077,992; 7,197,396; and 7,396,475, all of which are incorporated by reference herein.

A release agent can be applied to a patterned surface of an imprint lithography template, added to an imprint lithography resist, or both, to reduce separation defects in imprinted patterns formed in an imprint lithography process and to increase the number of successive imprints that can be made with an imprint lithography template. Factors in selecting a release agent for an imprint resist include, for example, reactivity with the surface, desired surface properties of the treated surface, and shelf life of the release agent (e.g., in an imprint resist). As described herein, when used as a release agent in an imprint resist, fluorinated silazanes provide substantially defect-free release of at least 100 successive imprints formed in an imprint lithography process without removal and/or cleaning of the template.

General formula (1) shows an example of a group of fluorinated silazanes that can be used as release agents in imprint lithography (e.g., applied to a surface of a template or added to an imprint resist). In general formula (1), $R_1$ represents H or $CH_3$,

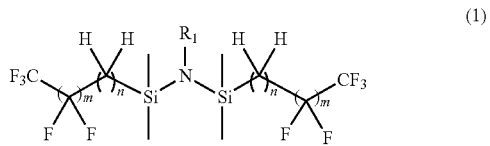

(1)

n is an integer from 1 to 5, and m is an integer from 1 to 40. An imprint resist can include between about 0.1 wt % and 30 wt % of a fluorinated silazane of general formula (1), excluding solvent. An imprint resist with a fluorinated silazane release agent can be used with an imprint lithography template that has, or does not have, a previously applied release layer. In some cases, an imprint lithography template may be treated with a fluorinated silazane (e.g., in a solvent) to form a release layer on the template before contacting an imprint resist with the template.

To test reactivity of fluorinated silazanes of general formula (1) with a glass surface, a glass slide was cut into 1 inch square pieces. Standard piranha cleaning ($H_2SO_4$: 30% $H_2O_2$=2:1) was applied to the glass pieces for 30 minutes. One glass piece was then immersed in a solution of 20 wt % of a fluorinated silazane of general formula (1) with $R_1$=H; n=2; m=5 ("F-silazane," available from Central Glass Co., Ltd. Japan) in toluene for 100 minutes. The glass piece was then rinsed with toluene and isopropyl alcohol and dried under a nitrogen purge. Contact angles of distilled water were measured at five different places on the treated surface. The same procedure was repeated for a cleaned but untreated surface, and for a glass piece treated with 20 wt % (tridecafluoro-1,1,2,2-tetrahydrooctyl)dimethylchlorosilane ("F-chlorosilane," available from Gelest, Inc., Morrisville, Pa.). Results are shown in Table 1.

TABLE 1

Water contact angles on treated and untreated glass

| Reagent | F-silazane | F-chlorosilane | No treatment |
|---|---|---|---|
| Contact angle (water) | 100.0° (± 0.7°) | 100.3° (± 0.5°) | 28.1° (± 1.2°) |

As seen in Table 1, the contact angle of water on the glass piece treated with F-silazane is about 100°. In comparison, a clean, untreated glass piece has a water contact angle of about 28°, and a glass piece treated with F-chlorosilane has a water contact angle of about 100°. Thus, a surface with an F-silazane release layer has a water contact angle comparable to the contact angle of water on a surface with an F-chlorosilane release layer.

Figure 3:
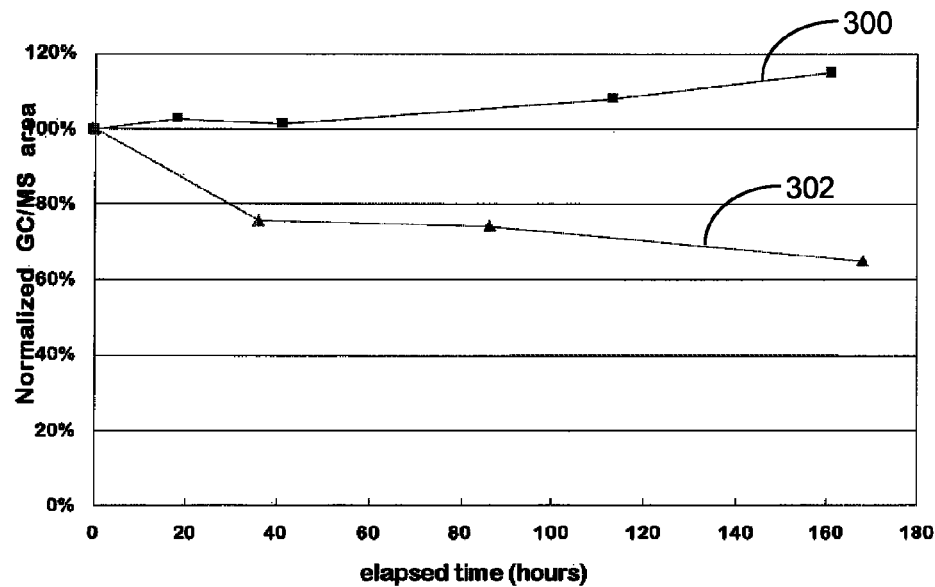
FIG. 3 includes plots showing decomposition of fluorinated release agents over time.

In another experiment, the shelf life of imprint resists shown as Samples A and B in Table 2 was monitored by GC/MS for one week. Sample A was prepared by mixing 33 wt % isobornyl acrylate (IBA), 33 wt % n-butyl acrylate (nBA), 16 wt % ethylene glycol diacrylate (EGDA), and 19 wt % of F-silazane, as described with respect to Table 1, in a glass vial. Sample B was prepared by mixing 33 wt % isobornyl acrylate (IBA), 33 wt % n-butyl acrylate (nBA), 16 wt % ethylene glycol diacrylate (EGDA), and 19 wt % of F-chlorosilane, also as described with respect to Table 1, in another glass vial. Plots 300 and 302 in FIG. 3 show the GC/MS peak areas of F-silazane and F-chlorosilane, respectively, over an elapsed time of 180 hours, normalized with respect to n-butyl acrylate. The imprint resist composition with F-silazane (Sample A) did not show signs of decomposition over a length of time up to a week. In contrast, the imprint resist composition with F-chlorosilane (Sample B) showed significant decomposition (about 20%) within 24 hours.

TABLE 2

Imprint resists including fluorinated additives

| | IBA (wt %) | nBA (wt %) | EGDA (wt %) | F-silazane (wt %) | F-chlorosilane (wt %) |
|---|---|---|---|---|---|
| Sample A | 32.6 | 32.5 | 16.2 | 18.7 | 0.0 |
| Sample B | 32.5 | 32.6 | 16.3 | 0.0 | 18.7 |

In another experiment, multiple imprints were performed with imprint resists shown by Sample C and Sample D in Table 3. Sample C was formed from 35 wt % IBA, 35 wt % nBA, 20 wt % EGDA, 4 wt % DAROCUR 1173 (a photoinitiator available from Ciba Specialty Chemicals, Switzerland), and 5 wt % F-silazane. Sample D was formed from 38 wt % IBA, 38 wt % nBA, 20 wt % EGDA, and 4 wt % DAROCUR 1173.

TABLE 3

| | IBA (wt %) | nBA (wt %) | EGDA (wt %) | DAROCUR 1173 (wt %) | F-silazane (wt %) |
|---|---|---|---|---|---|
| Sample C | 35.4 | 35.4 | 19.8 | 4.0 | 5.4 |
| Sample D | 38.2 | 38.0 | 19.8 | 4.0 | 0.0 |

Multiple imprints were performed with an IMPRIO® 100 imprint lithography system (available from Molecular Imprints, Inc., Austin, Tex.) with an automatic step and repeat function. Initially, the template was cleaned in a standard piranha process ($H_2SO_4$: 30% $H_2O_2$=2:1), then treated with a fluorinated surface treatment (tridecafluoro-1,1,2,2-tetrahydrooctyl)dimethylchlorosilane) in toluene (1 wt % solution) overnight to form a release layer on the mold. The treated template, a new 200 mm silicon substrate, and one of the imprint formulations (Sample C) were installed in the IMPRIO® 100. After 16 imprints, the template was removed and the water contact angle on the template was measured. Then the template was re-loaded in the IMPRIO® 100 and imprinting was continued. The procedure was repeated for a total of 100 imprints. The experiment was then carried out for the imprint formulation shown as Sample D in Table 3. Results are shown in FIG. 4.

Figure 4:
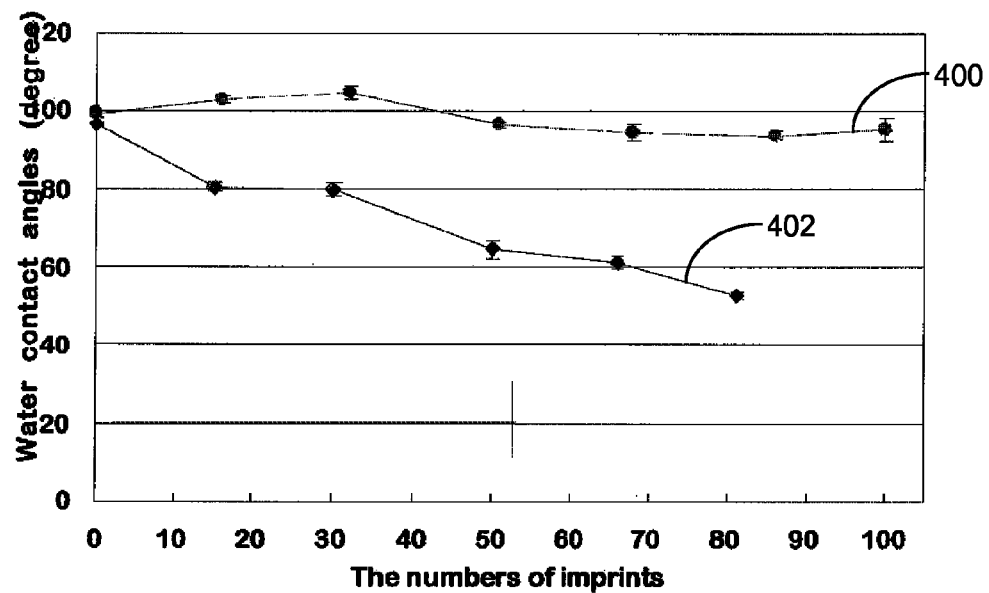
FIG. 4 includes plots showing change in water contact angle on imprint lithography templates as a function of number of successive imprints formed with the templates.

Plots 400 and 402 in FIG. 4 show water contact angles on the surface of the imprint lithography template in the process described above for Samples C and D, respectively. Plot 400 indicates that imprints formed with Sample C did not significantly affect the water contact angle on the template for up to 100 successive imprints. That is, the water contact angle on the template was substantially unchanged (i.e., the water contact angle on the template decreased by less than 5% from the first imprint to the 100$^{th}$ imprint). In contrast, as seen in plot 402, after imprints formed with Sample D, the template showed decreasing water contact angles and severe separation defects. Separation defects with Sample D were so severe that imprinting was discontinued after 82 imprints. Thus, the presence of the fluorinated silazane in Sample C allowed the template to be used for a greater number of substantially defect-free (e.g., separation-defect-free) successive imprints and thus extended the number of successive imprints that could be made with the template without removal and/or cleaning.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. An imprint lithography resist comprising:
    a polymerizable material and a fluorinated silazane having formula (1):

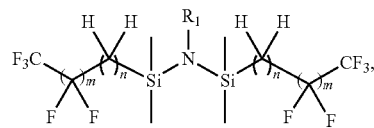

(1)

wherein $R_1$ represents H or $CH_3$, n is an integer from 1 to 5, and m is an integer from 1 to 40.

2. The imprint lithography resist of claim 1, further comprising a photoinitiator, a photoacid generator, or a photobase generator.

3. The imprint lithography resist of claim 1, further comprising a solvent, wherein the fluorinated silazane comprises about 0.1 wt % to about 30 wt % of the imprint lithography resist excluding the solvent.

4. The imprint lithography resist of claim 1, wherein $R_1$=H, n=2, and m=5.

5. An imprint lithography mold assembly comprising:
    an imprint lithography substrate;
    an imprint lithography resist disposed on the imprint lithography substrate;
    an imprint lithography template in contact with the imprint lithography resist, and
    wherein the imprint lithography resist comprises a polymerizable material and a fluorinated silazane having formula (1):

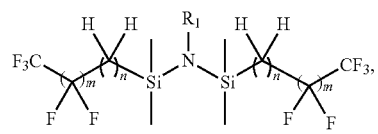

(1)

wherein $R_1$ represents H or $CH_3$, n is an integer from 1 to 5, and m is an integer from 1 to 40.

6. The imprint lithography mold assembly of claim 5, wherein $R_1$=H, n=2, and m=5.

7. The imprint lithography mold assembly of claim 5, further comprising a photoinitiator, a photoacid generator, or a photobase generator.

8. The imprint lithography mold assembly of claim 5, wherein the imprint lithography resist further comprises a solvent, and the fluorinated silazane comprises about 0.1 wt % to about 30 wt % of the imprint lithography resist excluding the solvent.

9. The imprint lithography mold assembly of claim 5, wherein the imprint lithography resist is disposed on the imprint lithography substrate in the form of discrete, spaced-apart drops.

10. The imprint lithography mold assembly of claim 5, wherein the imprint lithography template comprises a previously applied release layer.

11. The imprint lithography mold assembly of claim 10, wherein the previously applied release layer comprises a second fluorinated silazane having formula (1).

* * * * *